United States Patent
Yasuda et al.

(10) Patent No.: US 10,730,161 B2
(45) Date of Patent: Aug. 4, 2020

(54) METHOD FOR CONDITIONING POLISHING PAD AND POLISHING APPARATUS

(71) Applicant: SHIN-ETSU HANDOTAI CO., LTD., Tokyo (JP)

(72) Inventors: Taichi Yasuda, Kita-ku (JP); Masanao Sasaki, Nishigo-mura (JP); Tatsuo Enomoto, Setagaya-ku (JP); Takuya Sasaki, Shirakawa (JP); Kazumasa Asai, Nagano (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 134 days.

(21) Appl. No.: 15/760,590

(22) PCT Filed: Aug. 31, 2016

(86) PCT No.: PCT/JP2016/003963
§ 371 (c)(1),
(2) Date: Mar. 15, 2018

(87) PCT Pub. No.: WO2017/056392
PCT Pub. Date: Apr. 6, 2017

(65) Prior Publication Data
US 2018/0264618 A1  Sep. 20, 2018

(30) Foreign Application Priority Data

Oct. 1, 2015 (JP) .................................. 2015-196125

(51) Int. Cl.
*B24B 1/00* (2006.01)
*B24B 37/005* (2012.01)
(Continued)

(52) U.S. Cl.
CPC ............ *B24B 37/005* (2013.01); *B24B 37/00* (2013.01); *B24B 37/08* (2013.01); *B24B 37/107* (2013.01);
(Continued)

(58) Field of Classification Search
CPC ....... B24B 37/005; B24B 37/00; B24B 37/08; B24B 37/10; B24B 37/107; B24B 49/18;
(Continued)

(56) References Cited

U.S. PATENT DOCUMENTS 6,702,646 B1 * 3/2004 Gitis ....................... B24B 49/04
  451/21
6,752,697 B1 * 6/2004 Stoeckgen ............ B24B 53/017
  451/285

(Continued)

FOREIGN PATENT DOCUMENTS

CN    102814738 A   12/2012
JP    H10-202503 A   8/1998
(Continued)

OTHER PUBLICATIONS

Jan. 17, 2019 Chinese Office Action issued in Chinese Application No. 201680054094.8.
(Continued)

*Primary Examiner* — Joseph J Hail
*Assistant Examiner* — Shantese L McDonald
(74) *Attorney, Agent, or Firm* — Oliff PLC

(57) ABSTRACT

A method for conditioning a polishing pad, which is configured to polish a wafer and attached to a rotatable discoid turntable, by using a conditioning head, the method being characterized by: moving the conditioning head in a radial direction of the turntable to perform the conditioning while rotating the polishing pad attached to the turntable by rotation of the turntable; and controlling a rotational speed
(Continued)

of the turntable and a moving speed of the conditioning head in the radial direction of the turntable in correspondence with a distance of the conditioning head from a center of the turntable. Consequently, the method for conditioning a polishing pad which enables appropriately conditioning an entire polishing surface of the polishing pad can be provided.

2 Claims, 5 Drawing Sheets

(51) Int. Cl.
    *B24B 53/017*     (2012.01)
    *B24B 53/12*     (2006.01)
    *B24B 53/00*     (2006.01)
    *B24B 37/00*     (2012.01)
    *B24B 37/10*     (2012.01)
    *B24B 37/08*     (2012.01)
    *H01L 21/67*     (2006.01)

(52) U.S. Cl.
    CPC ............ *B24B 53/00* (2013.01); *B24B 53/017* (2013.01); *B24B 53/12* (2013.01); *H01L 21/67092* (2013.01)

(58) Field of Classification Search
    CPC ....... B24B 53/00; B24B 53/012; B24B 53/12; B24B 53/02; H01L 21/67092
    USPC .......................................... 451/1, 5, 8, 11, 28
    See application file for complete search history.

(56) References Cited

U.S. PATENT DOCUMENTS

| | | | |
|---|---|---|---|
| 6,905,571 B2 * | 6/2005 | Sakuma | B24B 53/017 134/114 |
| 7,020,306 B2 * | 3/2006 | Hirose | B24B 37/20 382/108 |
| 7,762,871 B2 * | 7/2010 | Bajaj | B24B 37/20 451/56 |
| 8,398,463 B2 * | 3/2013 | Bajaj | B24B 53/017 451/56 |
| 2004/0166785 A1 | 8/2004 | Golzarian et al. | |
| 2007/0205112 A1 * | 9/2007 | Kodera | B23H 5/08 205/641 |
| 2007/0227902 A1 * | 10/2007 | Du | B23H 5/08 205/663 |
| 2007/0254558 A1 | 11/2007 | Kodera et al. | |
| 2010/0081361 A1 | 4/2010 | Fukuda et al. | |
| 2012/0315829 A1 | 12/2012 | Tanikawa et al. | |

FOREIGN PATENT DOCUMENTS

| | | |
|---|---|---|
| JP | 2002-355748 A | 12/2002 |
| JP | 2004-047876 A | 2/2004 |
| JP | 2006-186088 A | 7/2006 |
| JP | 2010-076049 A | 4/2010 |
| TW | 201304907 A | 2/2013 |

OTHER PUBLICATIONS

Oct. 25, 2016 International Search Report issued in International Patent Application No. PCT/JP2016/003963.
Apr. 3, 2018 International Preliminary Report on Patentability issued in Patent Application No. PCT/JP2016/003963.
May 1, 2018 Office Action issued in Japanese Patent Application No. 2015-196125.
Mar. 20, 2020 Office Action issued in Taiwanese Patent Application No. 105128617.

* cited by examiner

METHOD FOR CONDITIONING POLISHING PAD AND POLISHING APPARATUS

TECHNICAL FIELD

The present invention relates to a method for conditioning a polishing pad and a polishing apparatus.

BACKGROUND ART

In case of planarizing a sheet-like workpiece, e.g., a silicon wafer in conventional examples, a polishing apparatus such as a single-side polishing apparatus or a double-side polishing apparatus is used.

For example, in the single-side polishing apparatus, a polishing pad made of urethane foam or a nonwoven fabric is attached to a discoid turntable which is driven to rotate, and polishing slurry to improve polishing efficiency is flowed. Further, a wafer held on a polishing head is pressed against the polishing pad to perform polishing. The wafer can be attached to the polishing head by a wax, vacuum, or surface tension of a liquid.

Furthermore, for example, in the double-side polishing apparatus, a discoid planetary gear called a carrier is arranged between upper and lower discoid turntables having polishing pads made of urethane foam or a nonwoven fabric attached thereto respectively. A workpiece is inserted into and held in a holding hole of this planetary gear, and a sun gear and an internal gear meshing with the planetary gear are mutually rotated to bring about rotation and revolution of the planetary gear. The double-side polishing apparatus simultaneously polishes upper and lower surfaces of the wafer by the rotation, the revolution, rotation of the upper and lower turntables, and rubbing against the wafer. During the double-side polishing, to efficiently perform the polishing, the polishing slurry is supplied from a plurality of holes provided in the upper turntable.

However, in the polishing pad used in such a polishing apparatus, so-called clogging occurs. The clogging means that residues of a polished wafer, solid matters contained in the polishing slurry, or their mixtures are deposited on a surface layer of the polishing pad or accumulated in the polishing pad. The clogging degrades polishing efficiency or degrades flatness or surface quality of each polished workpiece.

It is general to perform various kinds of conditioning for different purposes to such degeneration of the polishing pad as described above. As the conditioning, for example, there is a method for jetting high-pressure water to a surface of the polishing pad from a cleaning nozzle head to eliminate the clogging. Furthermore, there is also a method for pressing a dressing head in which abrasive grains made of diamond are scattered against a surface of the polishing pad and scraping away a surface layer of the polishing pad including the clogging by friction of the abrasive grains and the polishing pad provided by rotating the turntable.

At the time of performing the conditioning for the polishing pad, the cleaning nozzle head or the dressing head often has an area which is obviously smaller than a surface used for polishing (a polishing surface) of the polishing pad. Thus, to clean or dress the entire polishing surface of the polishing pad, such a conditioning head is disposed to an arm, and the head can be moved from the outermost periphery to the innermost periphery of the turntable when the arm is linearly moved or turned (see, e.g., Patent Literature 1). Moreover, as disclosed in Patent Literature 1, when the turntable is rotated simultaneously with the movement of the head, the head can clean or dress the entire polishing surface of the polishing pad.

CITATION LIST

Patent Literature

Patent Literature 1: Japanese Unexamined Patent Publication (Kokai) No. Hei 10-202503

DISCLOSURE OF INVENTION

Problem to be Solved by the Invention

In recent years, with high integration of semiconductor devices, a request for flatness or surface quality of silicon wafers is becoming more rigorous. To meet such a quality request, it is important to always maintain the polishing surface of the polishing pad in the double-side polishing apparatus or the single-side polishing apparatus in an appropriate state.

However, in an actual process of double-side polishing or single-side polishing, the polishing pad surface is clogged, or a resin of the polishing pad surface itself is degenerated or deformed. Such a change in state of the polishing pad induces a reduction or unevenness of wafer quality. To prevent the reduction and the unevenness of wafer quality, it is important to always maintain the polishing surface of the polishing pad in a uniform and excellent state.

On the other hand, an increase in diameter of wafers in recent years has resulted in enlargement of polishing apparatuses, and an area of each polishing pad also tends to increase. When the conditioning was performed while rotating such a polishing pad with a large area, a problem that the polishing pad does not become the uniform and excellent state has occurred. Consequently, a problem that flatness of each polished wafer is degraded has arisen.

In view of such a problem as described above, it is an object of the present invention to provide a method for conditioning a polishing pad and a polishing apparatus which enable appropriately conditioning an entire polishing surface of a polishing pad.

Means for Solving Problem

To achieve the object, the present invention provides a method for conditioning a polishing pad by which the polishing pad, which is configured to polish a wafer and attached to a rotatable discoid turntable, is conditioned by using a conditioning head, comprising:

moving the conditioning head in a radial direction of the turntable to perform the conditioning while rotating the polishing pad attached to the turntable by rotation of the turntable; and controlling a rotational speed of the turntable and a moving speed of the conditioning head in the radial direction of the turntable in correspondence with a distance of the conditioning head from a center of the turntable.

As described above, controlling the rotational speed of the turntable and the moving speed of the conditioning head in the radial direction of the turntable in correspondence with the distance of the conditioning head from the center of the turntable enables appropriately conditioning the entire polishing surface of the polishing pad.

At this time, it is preferable that the rotational speed of the turntable and the moving speed of the conditioning head in the radial direction of the turntable are controlled in such a manner that the rotational speed of the turntable meets a following Expression (1) and a moving operation of the conditioning head in the radial direction of the turntable meets following Expressions (2) and (3), $$T(r) = Tr_0 \times (r_0/r) \quad (1)$$

$$V(r) = (r_0/r)V_0 \quad (2)$$

$$D \div Q = n \quad (3)$$

wherein, "$T(r)$" represents the rotational speed (rpm) of the turntable when a distance of the conditioning head from the center of the turntable is "$r$", "$Tr_0$" represents the rotational speed (rpm) of the turntable at the start of the conditioning, "$r_0$" represents a distance (m) of the conditioning head from the center of the turntable at the start of the conditioning, "$r$" represents a distance (m) of the conditioning head from the center of the turntable, "$V(r)$" represents a moving speed (m/sec) of the conditioning head in the radial direction of the turntable when a distance of the conditioning head from the center of the turntable is "$r$", "$V_0$" represents a moving speed (m/sec) of the conditioning head in the radial direction of the turntable at the start of the conditioning, "D" represents a size (m) of the conditioning head in the radial direction of the turntable, "Q" represents a distance (m) for which the conditioning head radially moves on the turntable when the turntable makes one rotation, and "n" represents a positive integer.

When the conditioning is carried out under the conditions which meet Expression (1) and Expression (2) at the same time, i.e., the conditions under which the distance of the conditioning head from the center of the turntable is made inverse-proportional to the rotational speed of the turntable and the distance of the conditioning head from the center of the turntable is also made inverse-proportional to the moving speed of the conditioning head in the radial direction of the turntable as well as the conditions which also meet Expression (3), i.e., the conditions under which the conditioning head can necessarily condition the entire surface of the polishing pad attached to the turntable by contact or the like while the turntable rotates and the conditioning head radially moves on the turntable and also conditioning can be performed at any position on the pad for the same number of times by contact or the like with the conditioning head, the entire polishing surface of the polishing pad can be uniformly conditioned.

Additionally, to achieve the object, the present invention provides a polishing apparatus comprising a conditioning head for conditioning a polishing pad which is configured to polish a wafer and attached to a rotatable discoid turntable, wherein the conditioning head is moved in a radial direction of the turntable to perform the conditioning while rotating the polishing pad attached to the turntable by rotation of the turntable, and the polishing apparatus comprises a control mechanism which controls a rotational speed of the turntable and a moving speed of the conditioning head in the radial direction of the turntable in correspondence with a distance of the conditioning head from a center of the turntable.

As described above, the polishing apparatus which can control the rotational speed of the turntable and the moving speed of the conditioning head in the radial direction of the turntable in correspondence with the distance of the conditioning head from the center of the turntable can set the conditions under which the entire polishing surface of the polishing pad can be appropriately conditioned.

At this time, it is preferable that the control mechanism controls the rotational speed of the turntable and the moving speed of the conditioning head in the radial direction of the turntable in such a manner that the rotational speed of the turntable meets a following Expression (1) and a moving operation of the conditioning head in the radial direction of the turntable meets following Expressions (2) and (3), $$T(r) = Tr_0 \times (r_0/r) \quad (1)$$

$$V(r) = (r_0/r)V_0 \quad (2)$$

$$D \div Q = n \quad (3)$$

wherein, "$T(r)$" represents the rotational speed (rpm) of the turntable when a distance of the conditioning head from the center of the turntable is "$r$", "$Tr_0$" represents the rotational speed (rpm) of the turntable at the start of the conditioning, "$r_0$" represents a distance (m) of the conditioning head from the center of the turntable at the start of the conditioning, "$r$" represents a distance (m) of the conditioning head from the center of the turntable, "$V(r)$" represents a moving speed (m/sec) of the conditioning head in the radial direction of the turntable when a distance of the conditioning head from the center of the turntable is "$r$", "$V_0$" represents a moving speed (m/sec) of the conditioning head in the radial direction of the turntable at the start of the conditioning, "D" represents a size (m) of the conditioning head in the radial direction of the turntable, "Q" represents a distance (m) for which the conditioning head radially moves on the turntable when the turntable makes one rotation, and "n" represents a positive integer.

If the conditioning can be carried out under the conditions which can meet Expressions (1), (2), and (3) at the same time, the entire polishing surface of the polishing pad can be uniformly conditioned.

Effect of the Invention

According to the method for conditioning a polishing pad and the polishing apparatus of the present invention, the conditions under which the entire polishing surface of the polishing pad can be appropriately conditioned can be set, and degradation of flatness of each polished wafer can be suppressed.

BEST MODE(S) FOR CARRYING OUT THE INVENTION

Although an embodiment of the present invention will now be described hereinafter, the present invention is not restricted thereto.

As described above, there has been a problem that appropriately conditioning an entire polishing surface to realize a uniform state of the entire polishing state becomes difficult as an area of a polishing pad increases in particular.

Thus, the present inventors have repeatedly conducted the earnest examinations to solve such a problem. Consequently, they have acknowledged that an effect of the conditioning changes in correspondence with a distance of a conditioning head from a center of a turntable. Further, they have conceived that the rotational speed of the turntable and a moving speed of the conditioning head in a radial direction of the turntable can be controlled in correspondence with this distance to adjust the effect of the conditioning in each portion of the polishing pad, and that conditions which enable the conditioning to realize the uniform state of the entire polishing surface can be set to suppress degradation of flatness of each polished wafer, thereby bringing the present invention to completion.

First, a polishing apparatus according to the present invention will be described. The polishing apparatus according to the present invention may be a single-side polishing apparatus which polishes a single side of each wafer, or may be a double-side polishing apparatus which simultaneously polishes both sides of each wafer.

Figure 1:
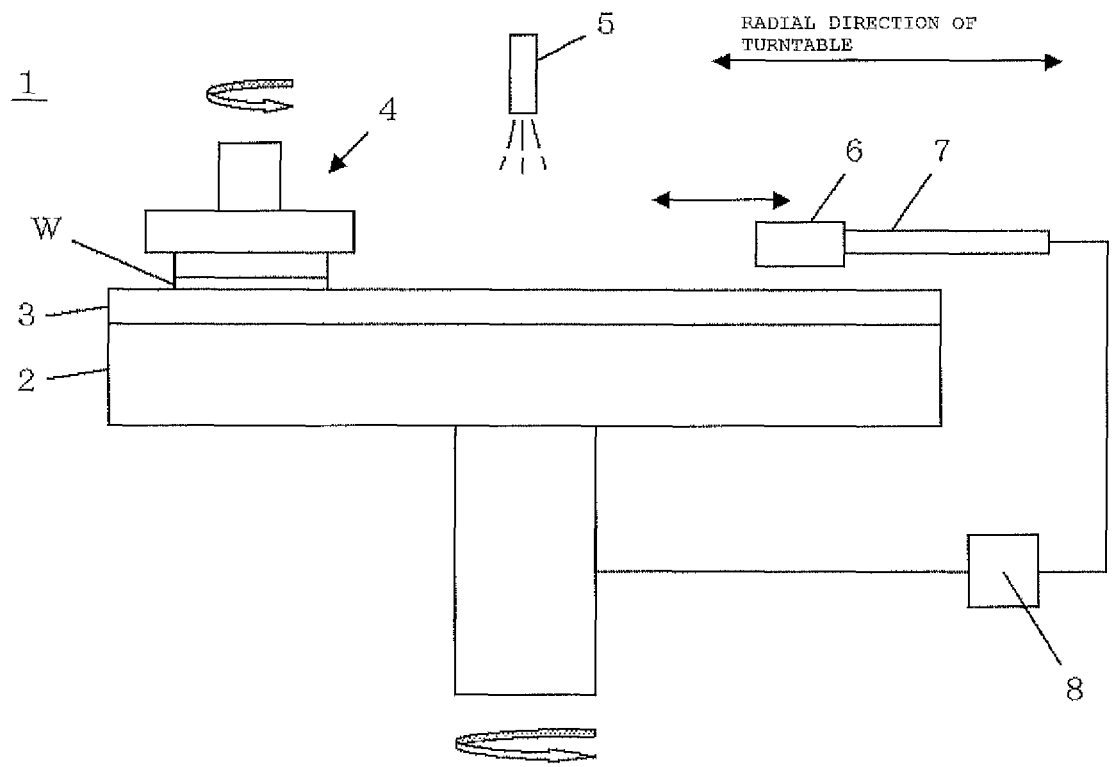
FIG. 1 is a schematic view showing an example where a polishing apparatus according to the present invention is a single-side polishing apparatus.

An example where the polishing apparatus according to the present invention is such a single-side polishing apparatus 1 as shown in FIG. 1 will be first described. As shown in FIG. 1, the single-side polishing apparatus 1 includes a rotatable discoid turntable 2, a polishing pad 3 attached to the turntable 2, a polishing head 4 configured to hold a wafer W, a polishing agent supply mechanism 5 which supplies a polishing agent to the polishing pad 3, and a conditioning head 6 which conditions the polishing pad 3.

In such a single-side polishing apparatus 1, the wafer W held by the polishing head 4 is pressed against the polishing pad 3 which is rotated by the turntable 2 to polish a surface of the wafer W. At this time, the polishing agent is supplied from the polishing agent supply mechanism 5 to a surface of the polishing pad 3.

Furthermore, the conditioning of the polishing pad 3 is performed at start-up to make the polishing pad which is unused for polishing operational for polishing, between polishing batches from end of polishing to start of subsequent polishing, and the like. It is to be noted that, as the conditioning head 6, a cleaning nozzle head which eliminates clogging by injecting high-pressure water to the surface of the polishing pad 3 can be used. Moreover, as the conditioning head 6, a dressing head in which abrasive grains made of diamond are scattered can be used. The dressing head performs dressing to scrape away a surface layer of the polishing pad including the clogging by pressing the abrasive grains against the surface of the polishing pad 3 while rotating the turntable 2 and thereby causing friction between the abrasive gains and the polishing pad 3.

The polishing apparatus according to the present invention performs the conditioning while rotating the polishing pad 3 attached to the turntable 2 by rotation of the turntable 2 and moving the conditioning head 6 in a radial direction of the turntable 2. In case of the single-side polishing apparatus 1 shown in FIG. 1, the conditioning head 6 is moved in the radial direction of the turntable 2 by an arm 7.

Moreover, the single-side polishing apparatus 1 includes a control mechanism 8 which controls the rotational speed of the turntable 2 and a moving speed of the conditioning head 6 in the radial direction of the turntable 2 in correspondence with a distance of the conditioning head 6 from a center of the turntable 2.

An effect of the conditioning in each portion of the polishing pad changes in correspondence with the distance of the conditioning head 6 from the center of the turntable 2. Thus, like the present invention, when the rotational speed of the turntable 2 and the moving speed of the conditioning head 6 in the radial direction of the turntable 2 are controlled in correspondence with the distance of the conditioning head 6 from the center of the turntable 2 to adjust the effect of the conditioning in each portion of the polishing pad 3, conditions which enable appropriately conditioning the entire polishing surface of the polishing pad 3 can be set. That is, the polishing apparatus according to the present invention can condition the polishing surface of the polishing pad 3 under the optimum conditions by controlling the rotational speed of the turntable 2 and the moving speed of the conditioning head 6 in the radial direction of the turntable 2 with the use of the control mechanism 8 during the conditioning, thus suppressing degradation of the flatness of each polished wafer.

Additionally, in the present invention, it is preferable for the control mechanism 8 to control the rotational speed of the turntable 2 and the moving speed of the conditioning head 6 in the radial direction of the turntable 2 in such a manner that the rotational speed of the turntable 2 meets the following Expression (1) and a moving operation of the conditioning head 6 in the radial direction of the turntable 2 meets the following Expressions (2) and (3), $$T(r) = Tr_0 \times (r_0/r) \qquad (1)$$

$$V(r) = (r_0/r)V_0 \qquad (2)$$

$$D \div Q = n \qquad (3)$$

wherein "T(r)" represents the rotational speed (rpm) of the turntable when the distance of the conditioning head 6 from the center of the turntable 2 is "r", "$Tr_0$" represents the rotational speed (rpm) of the turntable at the start of the conditioning, "$r_0$" represents a distance (m) of the conditioning head 6 from the center of the turntable 2 at the start of the conditioning, "r" represents a distance (m) of the conditioning head 6 from the center of the turntable 2, "V(r)" represents a moving speed (m/sec) of the conditioning head 6 in the radial direction of the turntable 2 when the distance of the conditioning head 6 from the center of the turntable 2 is "r", "$V_0$" represents a moving speed (m/sec) of the conditioning head 6 in the radial direction of the turntable 2 at the start of the conditioning, "D" represents a size (m) of the conditioning head 6 in the radial direction of the turntable, "Q" represents a distance (m) for which the conditioning head 6 radially moves on the turntable when the turntable makes one rotation, and "n" represents a positive integer.

Under control conditions which simultaneously meet Expression (1), Expression (2), and Expression (3), the polishing pad 3 can be assuredly conditioned under the uniform conditions. The reason will now be described hereinafter. As described above, as a method for obtaining a more uniform polishing surface by the conditioning, the present inventors have considered that finding out conditions which enable conditioning at any position on the polishing surface of the polishing pad under the same conditions is important. That is because, degeneration of the polishing surface does not uniformly occur on the entire surface of the polishing pad, but intensity of the conditioning in a region where the degeneration is considerable could be increased based on the conditions which enable uniformly conditioning the entire surface.

For example, a case where a dressing head as the conditioning head 6 dresses the polishing pad 3 while moving in the radial direction of the turntable 2 will now be considered. An amount of scraping away a surface layer of the polishing pad by the dressing head, which is a so-called stock removal can be generally represented as follows:

$$(\text{Stock removal}) \propto (\text{Pressure}) \times (\text{Contact speed}) \times (\text{Time}) \qquad (4)$$

As regards the pressure, since even a general apparatus can easily obtain a fixed load, when two requirements, i.e., a requirement that a turntable contact speed of the dressing head with the polishing pad 3 is fixed and a requirement that a contact time with the dressing head is fixed at any position on the polishing pad are added to this matter, the dressing can be performed under the more uniform conditions at any position on the polishing pad 3, and the uniform conditioning of the polishing pad 3 can be more assuredly carried out.

To fix the contact speed of the dressing head with the polishing pad, controlling the rotational speed of the turntable to meet Expression (1) can suffice. The reason will now be described hereinafter.

Figure 2:
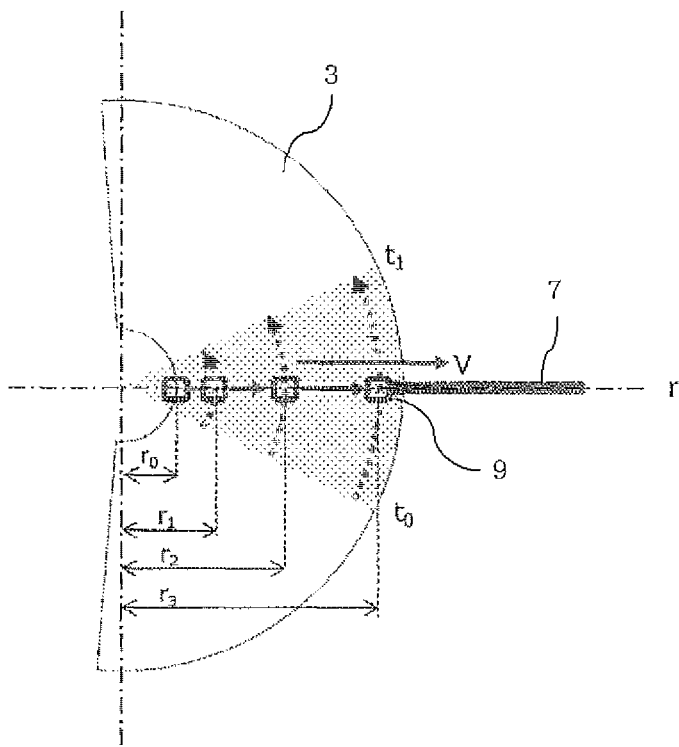
FIG. 2 is an explanatory drawing of a relationship between a distance of a dressing head from a center of a turntable and a distance for which a polishing pad and the dressing head dress.

First, a consideration will be given as to a case where the rotational speed of the turntable is fixed and the dressing head performs uniform linear motion from a central side toward an outer side of the turntable in the radial direction of the turntable. Since the rotational speed of the turntable is fixed, an angular velocity is fixed irrespective of a position of the dressing head in the radial direction. However, a distance and a speed for and at which the polishing pad and the dressing head are in contact with each other increase in proportion to a distance between the dressing head and the center of the turntable. This will now be described with reference to FIG. 2. As shown in FIG. 2, when a time has elapsed from $t_0$ to $t_1$, the polishing pad 3 rotates by rotation of the turntable. At positions with distances $r_1$, $r_2$ and $r_3$ from the center of the turntable, as indicated by arrows of broken lines, a contact distance of the polishing pad 3 and the dressing head 9 within the same time ($t_0$ to $t_1$) increases in proportion to a distance of the dressing head 9 from the center of the turntable. In other words, a contact speed increases. That is, the dressing with the different conditions is performed in correspondence with a position of the dressing head 9.

Figure 3:
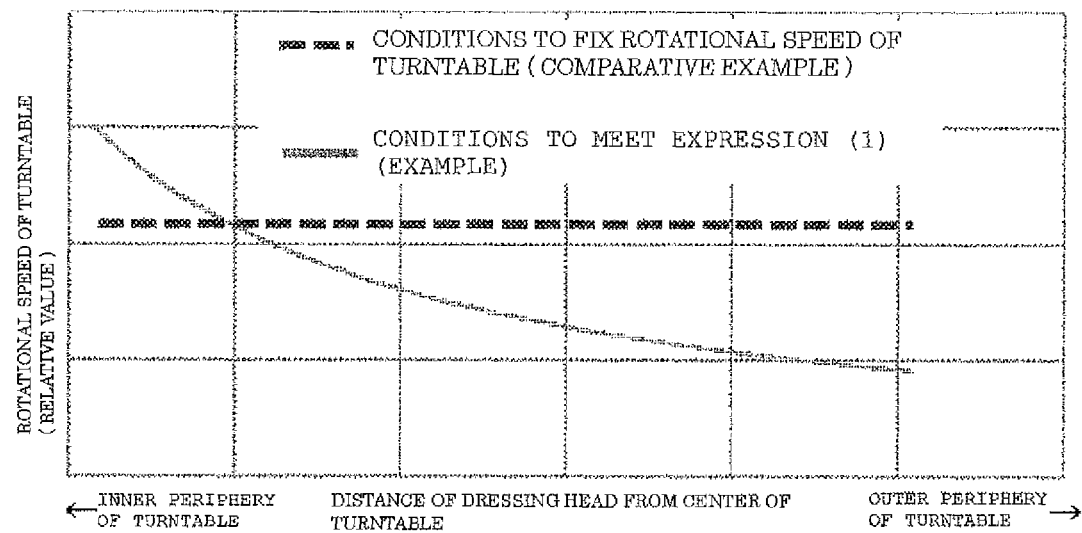
FIG. 3 is a graph showing a relationship between the distance of the dressing head from the center of the turntable and the rotational speed of the turntable.

To avoid this, the rotational speed of the turntable could be made inverse-proportional to the distance of the dressing head from the center of the turntable. That is, controlling the rotational speed of the turntable to meet Expression (1) can suffice. FIG. 3 shows a graph which represents a relationship between the rotational speed of the turntable and the distance of the dressing head from the center of the turntable when the rotational speed of the turntable is controlled to meet Expression (1). It is to be noted that the "rotational speed of turntable (relative value)" on an axis of ordinate in the graph shown in FIG. 3 is a relative value of the rotational speed of the turntable at each position after starting movement of the dressing head to the rotational speed of the turntable at the start of dressing. When the rotational speed of the turntable is controlled as shown in FIG. 3, the contact speed of the polishing pad and the dressing head within the same time does not change in correspondence with a position of the dressing head.

Further, to fix a contact time with the dressing head at any position on the polishing pad, controlling the moving speed of the dressing head in the radial direction of the turntable to meet Expressions (2) and (3) can suffice. The reason will now be described hereinafter.

Figure 4:
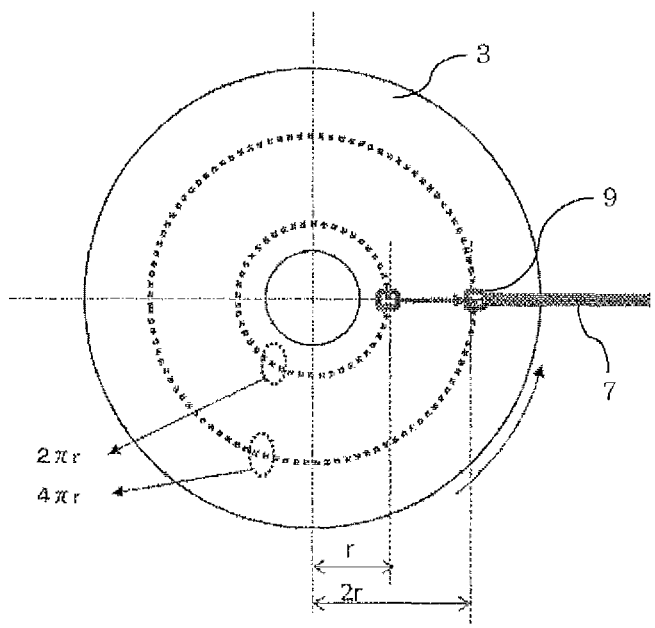
FIG. 4 is an explanatory drawing of a relationship between the distance of the dressing head from the center of the turntable and a distance for which the dressing head must dress.

Just meeting Expression (1) by the rotational speed of the turntable is insufficient to fix the contact time with the dressing head at any position on the polishing pad. For example, a case where the dressing head performs the uniform linear motion along the radius of the turntable from the inner side toward the outer side of the turntable will now be considered. When Expression (1) is met, the rotational speed of the turntable changes in correspondence with a position of the dressing head. Further, as shown in FIG. 4, when the dressing head 9 is placed at a position which is away from the center of the turntable by a distance r, the dressing head 9 must act on the polishing pad 3 on an entire circumference of a concentric circle having a radius r, namely, dressing must be performed to the entire circumference with the radius r. As shown in FIG. 4, when the dressing head 9 has reached r, a length of a circumference of a circle which must be dressed is $2\pi r$. On the other hand, when a position of the dressing head 9 has reached 2r, the dressing must be performed with respect to a length of $4\pi r$. That is, a length which must be subjected to the dressing increases in proportion to a distance of the dressing head 9 from the center of the turntable increases. Thus, if the dressing head 9 performs the uniform linear motion, a time during which the dressing head 9 is in contact with the polishing pad 3 is shortened in inverse proportion to the distance from the center. That is, conditions to fix the contact time cannot be provided.

Figure 5:
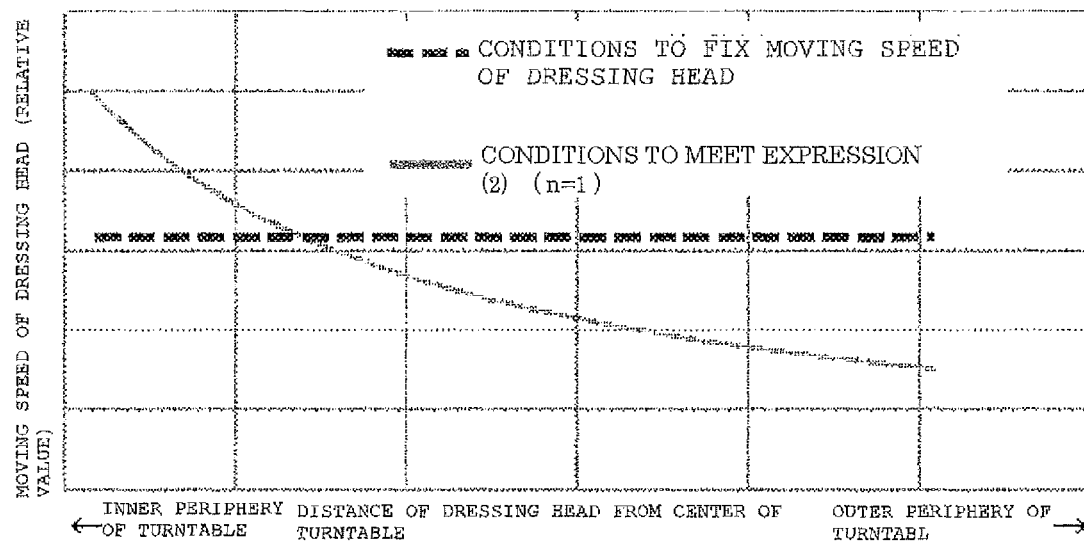
FIG. 5 is a graph showing a relationship between the distance of the dressing head from the center of the turntable and a moving speed of the dressing head.

To fix the contact time with the dressing head at any position on the polishing pad, the conditions for Expression (2) must first be met. This Expression (2) represents that the moving speed of the dressing head in the radial direction of the turntable is made inverse-proportional to the distance of the dressing head from the center of the turntable, namely, the moving speed of the dressing head in the radial direction of the turntable is controlled to meet Expression (2). FIG. 5 shows a graph representing a relationship between the moving speed of the dressing head in the radial direction of the turntable and the distance of the dressing head from the center of the turntable when Expression (2) is met. It is to be noted that a "moving speed of head (relative value)" on an axis of ordinate in the graph shown in FIG. 5 is a relative value of a moving speed of the dressing head in the radial direction of the turntable at each position to a moving speed of the dressing head in the radial direction of the turntable at the start of dressing.

Figure 6:
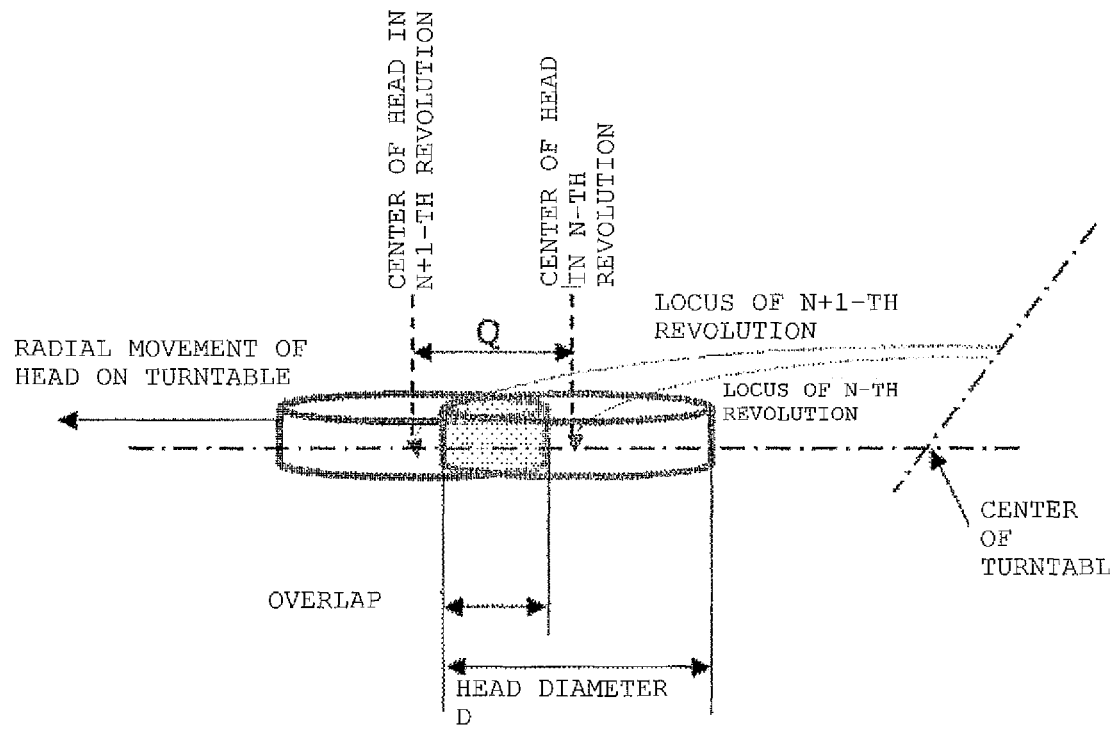
FIG. 6 is a view illustrating how a conditioning head which radially moves on the turntable comes into contact with the polishing pad while the turntable makes one rotation.

Further, Expression (3) will now be described with reference to FIG. 6. Here, a case where a columnar dressing head having a diameter D moves from the right to the left along the radius of the turntable is shown. Furthermore, two dressing heads shown in the drawing represent a position of the dressing head when the turntable started an N-th revolution and a position of the dressing head when the turntable started an N+1-th revolution. That is, a distance between the two dressing heads represents a distance Q for which the dressing head moves in the radial direction of the turntable while the turntable makes one rotation. This FIG. 6 shows a state where the dressing heads lie one upon another (overlap each other) in the N-th revolution and the N+1-th revolution.

Here, Expression (3) will now be considered. Since n is a positive integer in D÷Q=n, n is an integer which is 1 or more. That is, a condition which is D≥Q is automatically requested. If n=1, a condition that no overlap occurs but no gap is present between the N-th revolution and the N+1-h revolution and, if n>1, it represents that overlap occurs between the N-th revolution and the N+1-th revolution. However, if n<1, since a gap is produced between the N-th revolution and the N+1-th revolution and, at this moment, both undressed and dressed positions are present on the pad, and the condition that the contact time with the dressing head is fixed at any position on the polishing pad cannot be met.

Moreover, Expression (3) will be further described. The overlap means that the polishing pad comes into contact with the dressing head more than once while the turntable repeatedly makes rotations. To achieve the condition that the contact time with the dressing head is fixed at any position on the polishing pad while the overlap occurs, the number of times of contact with the dresser must remain the same at any position. To realize this, Expression (3) must be met.

Additionally, as to $r_0$, $V_0$, $T_{r_0}$, Q, and D in Expressions (1), (2), and (3), since $r_0$ is a radius of an inner peripheral portion of the turntable and D is a size of the dressing head, for example, they could be input as constants in a program in the control mechanism 8 in advance, and arbitrary values could be input as $V_0$, $T_{r_0}$, and Q in this program to use optimum values. In this manner, the rotational speed of the turntable and the moving speed of the conditioning head in the radius direction of the turntable may be controlled by software included in the control mechanism 8.

Further, in addition to the conditions of the three expressions, i.e., Expressions (1), (2), and (3), if a pressure of the dressing head to the polishing pad 3 is fixed, more uniform conditioning can be carried out. The pressure of the dressing head to the polishing pad 3 can be easily fixed if the dressing head can control a pressing pressure to the pad constant. Furthermore, when a cleaning nozzle head is included as the conditioning head, a head having a fixed water jetting pressure can suffice.

Moreover, in the present invention, when the conditioning head is placed on an arbitrary part of the polishing pad, an amount of conditioning at this position may be arbitrary set. Degeneration of the polishing pad does not uniformly occur on the entire surface of the polishing pad, but it has a distribution or a peak due to a locus of each wafer on the polishing turntable. Thus, in addition to the conditions to make the effect of the conditioning constant on the entire surface, when an amount of the conditioning at an arbitrary position can be adjusted, the polishing pad can be maintained in a further uniform state.

For example, to intensively perform the conditioning at an arbitrary position on the polishing pad, there are (a) a method for increasing the rotational speed of the turntable at that position to enhance the efficiency of the conditioning, (b) a method for lowering the moving speed of the conditioning head at that position to increase a conditioning time, and (c) a method for increasing a dressing pressure or a water pressure at that position to enhance the efficiency of the conditioning. Adopting such methods enables intensively performing the conditioning at, e.g., a position where degeneration of the polishing pad is particularly considerable.

Figure 7:
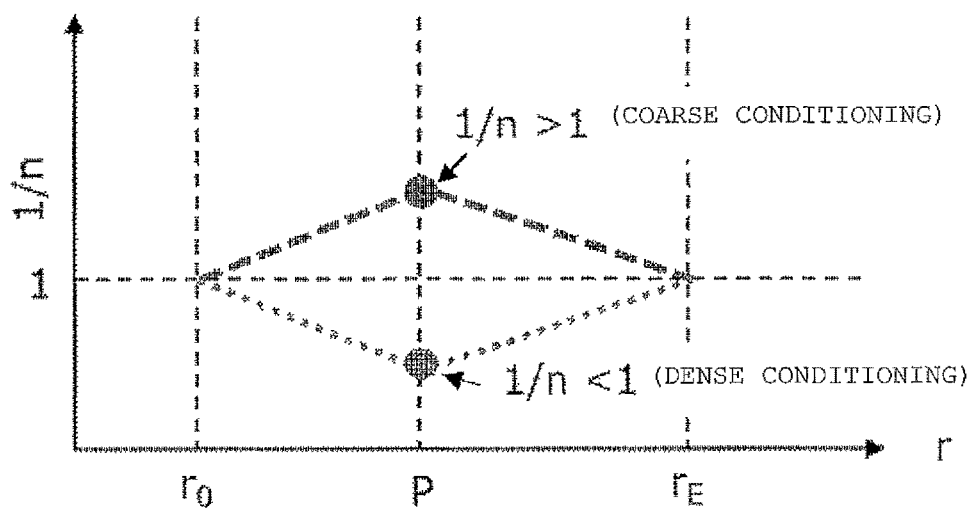
FIG. 7 is a graph showing a relationship between coarseness/denseness of conditioning and a speed ratio (1/n) of the conditioning head.

For example, like the condition (b), in case of lowering the moving speed of the conditioning head, the moving speed of the conditioning head in the radial direction of the turntable could be controlled in correspondence with the distance of the conditioning head from the center of the turntable as shown in FIG. 7. Here, P shown in FIG. 7 indicates a distance of the conditioning head at an arbitrary position on the polishing pad from the center of the turntable, and 1/n indicates a speed ratio to a moving speed of the conditioning head in the radial direction of the turntable provided under the conditions which enable uniformly conditioning the entire surface of the polishing pad, i.e., a speed ratio to a moving speed of the conditioning head in the radial direction of the turntable provided under the conditions which simultaneously meet Expressions (1) and (2). Thus, 1/n=1 is a condition under which the entire surface of the polishing pad can be uniformly conditioned. 1/n<1 is a condition under which denser conditioning can be carried out with P, and 1/n>1 is a condition under which coarser conditioning can be carried out. Moreover, $r_0$ in FIG. 7 represents a distance of the conditioning head from the center of the turntable at the start of the conditioning, and $r_E$ represents a distance of the conditioning head from the center of the turntable at the end of the conditioning. If n when the conditioning head reaches P can be set, coarseness/denseness of the conditioning can be set at an arbitrary point in correspondence with a distance of the conditioning head from the center of the turntable.

Figure 8:
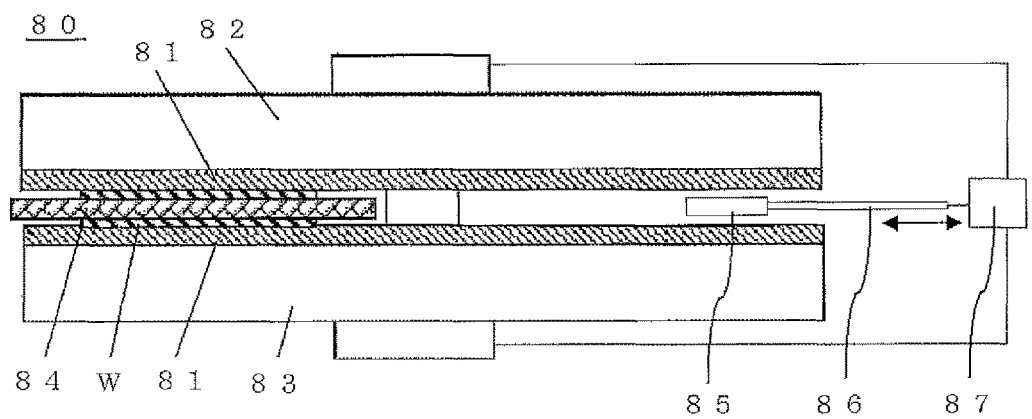
FIG. 8 is a schematic view showing an example where the polishing apparatus according to the present invention is a double-side polishing apparatus.

Although the case where the polishing apparatus of the present invention is the single-side polishing apparatus has been described, the polishing apparatus of the present invention may be a double-side polishing apparatus as described above. In such a double-side polishing apparatus 80 as shown in FIG. 8, a discoid planetary gear called a carrier 84 is arranged between upper and lower discoid turntables 82 and 83 each of which has a polishing pad 81 attached thereto. A wafer W is inserted into and held in a holding hole of this carrier 84, and a sun gear (not shown) meshing with the carrier 84 and an internal gear (not shown) are mutually rotated to bring about rotation and revolution of the planetary gear. The double-side polishing apparatus 80 simultaneously polishes upper and lower surfaces of the wafer by rubbing of the polishing pads 81 against the wafer W caused by the rotation, the revolution, and rotation of the upper and lower turntables.

Further, the double-side polishing apparatus 80 can condition the polishing pad 81 attached to the upper turntable 82 and the polishing pad 81 attached to the lower turntable 83 by using a conditioning head 85. Furthermore, the conditioning head 85 can move in a radial direction of the turntables by an arm 86. It is to be noted that a specific conditioning method is the same as that of the single-side polishing apparatus 1 described above. That is, the rotational speed of each of the upper and lower turntables 82 and 83 and a moving speed of the conditioning head 85 in the radial direction of the turntable 82 and 83 can be controlled by a control mechanism 87 in correspondence with a distance of the conditioning head 85 from a center of each of the turntables 82 and 83.

A method for conditioning a polishing pad according to the present invention will now be described. The present invention provides a method for conditioning a polishing pad, which is configured to polish each wafer and attached to a rotatable discoid turntable, by using a conditioning head. More specifically, this is a method for conditioning a polishing pad attached to a turntable of the single-side polishing apparatus or each of upper and lower turntables of the double-side polishing apparatus.

Moreover, in the present invention, the conditioning head is moved in the radial direction of the turntable to perform the conditioning while rotating the polishing pad attached to the turntable by rotation of the turntable. At this time, a rotational speed of the turntable and a moving speed of the conditioning head in the radial direction of the turntable are controlled in correspondence with a distance of the conditioning head from the center of the turntable. When the control is performed in this manner, a polishing surface of the polishing pad can be conditioned under optimum conditions.

It is to be noted that the conditioning can be performed at start-up to make the polishing pad which is unused for polishing operational for polishing, between polishing batches from end of polishing to start of subsequent polishing, and the like. It is to be noted that, as the conditioning head, a cleaning nozzle head or a dressing head can be used.

Furthermore, in the method for conditioning a polishing pad according to the present invention, it is preferable to control the rotational speed of the turntable and the moving speed of the conditioning head in the radial direction of the turntable in such a manner that the rotational speed of the turntable meets Expression (1) and a moving operation of the conditioning head in the radial direction of the turntable meets Expressions (2) and (3). When control conditions which can meet Expressions (1), (2), and (3) at the same time are adopted, the uniform conditioning of the polishing pad can be more assuredly performed.

EXAMPLES

The present invention will now be more specifically described hereinafter with reference to an example and a comparative example thereof, but the present invention is not restricted thereto.

Example

Both sides of a silicon wafer were polished while performing conditioning of polishing pads on upper and lower turntables of a double-side polishing apparatus between polishing batches in a double-side polishing process of the silicon wafer in accordance with a conditioning method of the present invention. In this example, as the double-side polishing apparatus, such a double-side polishing apparatus of the present invention as shown in FIG. 8 was used. Moreover, the silicon wafer having a diameter of 300 mm was polished. As a conditioning head, a dressing head was used. That is, as the conditioning, dressing was performed. After continuously performing the double-side polishing process as described above, GBIR (Global Backsurface-referenced Ideal plane/Range) of the silicon wafer subjected to the double-side polishing was measured, and flatness was evaluated.

In the dressing, the dressing of the polishing pad was performed while moving the dressing head from a central side toward an outer side of each turntable. Moreover, during the dressing, a rotational speed of each turntable and a moving speed of the dressing head in a radial direction of the turntables were controlled as described below. First, the rotational speed of each turntable was made inverse-proportional to a distance of the conditioning head from the center of the turntables so as to meet Expression (1). Changes in the rotational speed of each turntable are as indicated by a curved line in FIG. 3.

Figure 9:
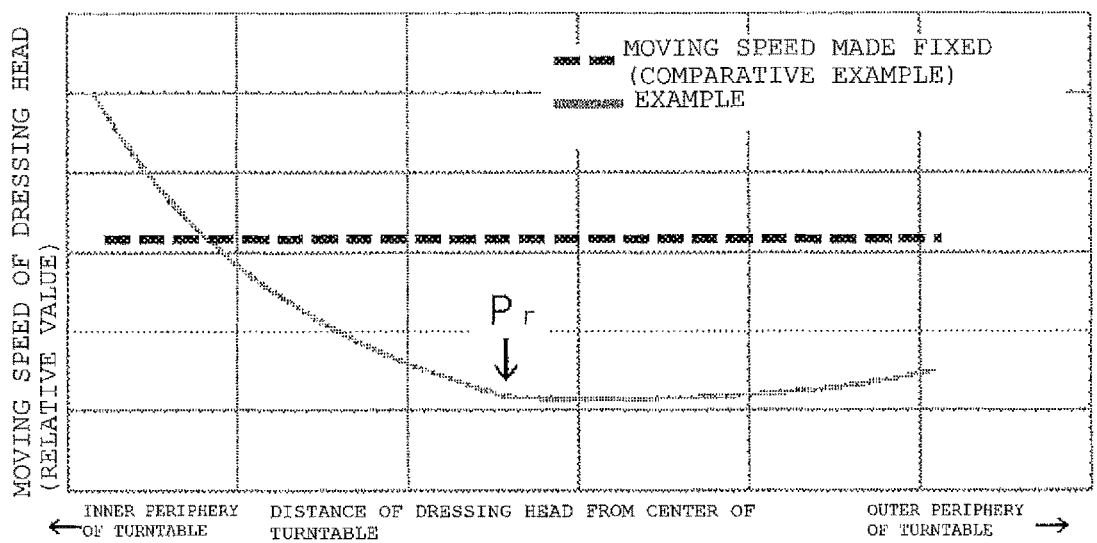
FIG. 9 is a graph showing a relationship between a distance of a dressing head from a center of the turntable and a moving speed of the dressing head in Example.

As to the moving speed of the dressing head in the radial direction of the turntables, conditions which meet Expressions (2) and (3) were adopted for the innermost periphery and the outermost periphery of the turntable. Further, the speed was linearly lowered as the dressing head got closer to a position Pr and, in the vicinity of the position Pr where degeneration of the polishing pad due to polishing becomes maximum, the moving speed was controlled in such a manner that the condition under which 1/n becomes 1/2 was met, i.e., the dressing had double density at the position Pr. FIG. 9 shows the moving speed of the dressing head in the radial direction of the turntables controlled as described above in correspondence with a distance of the dressing head from the center of the turntable.

Comparative Example

Double-side polishing of a silicon wafer was performed while carrying out dressing between polishing batches under the same conditions as those of Example except that a rotational speed of each turntable and a moving speed of a dressing head in a radial direction of turntables during the dressing were set to be constantly fixed without being controlled. Then, like Example, GBIR of the silicon wafer subjected to the double-side polishing was measured, and flatness was evaluated. FIGS. 3 and 9 show the rotational speed of each turntable and the moving speed of the dressing head in the radial direction of turntables during the dressing, respectively (broken lines in FIGS. 3 and 9).

Figure 10:
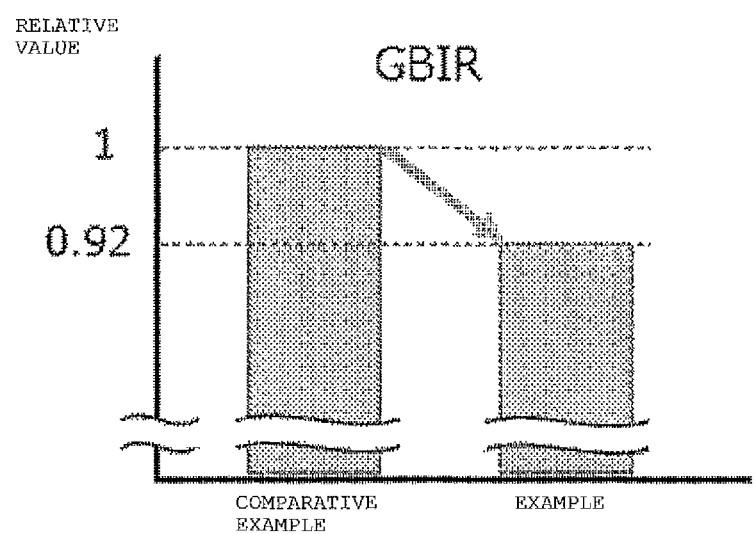
FIG. 10 is a view showing flatness of wafers subjected to double-side polishing in Example and Comparative Example.

Consequently, as shown in FIG. 10, GBIR of Example was improved 8% as compared with Comparative Example. According to the present invention, since the conditioning of the polishing pad can be performed under the optimum conditions, it was confirmed that degradation of flatness of each polished wafer can be suppressed.

It is to be noted that the present invention is not restricted to the embodiment. The embodiment is an illustrative example, and any example which has substantially the same structure and exerts the same functions and effects as the technical concept described in claims of the present invention is included in the technical scope of the present invention.

The invention claimed is:

1. A method for conditioning a polishing pad by which the polishing pad, which is configured to polish a wafer and attached to a rotatable discoid turntable, is conditioned by using a conditioning head, comprising:
   moving the conditioning head in a radial direction of the turntable to perform the conditioning while rotating the polishing pad attached to the turntable by rotation of the turntable; and
   controlling a rotational speed of the turntable and a moving speed of the conditioning head in the radial direction of the turntable in correspondence with a distance of the conditioning head from a center of the turntable,
   wherein the rotational speed of the turntable and the moving speed of the conditioning head in the radial direction of the turntable are controlled in such a manner that the rotational speed of the turntable meets Expression (1) and a moving operation of the conditioning head in the radial direction of the turntable meets Expressions (2) and (3), $$T(r) = Tr_0 \times (r_0/r) \quad (1)$$

$$V(r) = (r_0/r)V_0 \quad (2)$$

$$D \div Q = n \quad (3)$$

wherein "T(r)" represents the rotational speed (rpm) of the turntable when a distance of the conditioning head from the center of the turntable is "r", "$Tr_0$" represents the rotational speed (rpm) of the turntable at the start of the conditioning, "$r_0$" represents a distance (m) of the conditioning head from the center of the turntable at the start of the conditioning, "r" represents a distance (m) of the conditioning head from the center of the turntable, "V(r)" represents a moving speed (m/sec) of the conditioning head in the radial direction of the turntable when a distance of the conditioning head from the center of the turntable is "r", "$V_0$" represents a moving speed (m/sec) of the conditioning head in the radial direction of the turntable at the start of the conditioning, "D" represents a size (m) of the conditioning head in the radial direction of the turntable, "Q" represents a distance (m) for which the conditioning head radially moves on the turntable when the turntable makes one rotation, and "n" represents a positive integer.

2. A polishing apparatus comprising a conditioning head for conditioning a polishing pad which is configured to polish a wafer and attached to a rotatable discoid turntable, wherein the conditioning head is moved in a radial direction of the turntable to perform the conditioning while rotating the polishing pad attached to the turntable by rotation of the turntable, and the polishing apparatus comprises a control mechanism which controls a rotational speed of the turntable and a moving speed of the conditioning head in the radial direction of the turntable in correspondence with a distance of the conditioning head from a center of the turntable, wherein the control mechanism controls the rotational speed of the turntable and the moving speed of the conditioning head in the radial direction of the turntable in such a manner that the rotational speed of the turntable meets Expression (1) and a moving operation of the conditioning head in the radial direction of the turntable meets Expressions (2) and (3), $$T(r) = Tr_0 \times (r_0/r) \quad (1)$$

$$V(r) = (r_0/r)V_0 \quad (2)$$

$$D + Q = n \quad (3)$$

wherein "T(r)" represents the rotational speed (rpm) of the turntable when a distance of the conditioning head from the center of the turntable is "r", "$Tr_0$" represents the rotational speed (rpm) of the turntable at the start of the conditioning, "$r_0$" represents a distance (m) of the conditioning head from the center of the turntable at the start of the conditioning, "r" represents a distance (m) of the conditioning head from the center of the turntable, "V(r)" represents a moving speed (m/sec) of the conditioning head in the radial direction of the turntable when a distance of the conditioning head from the center of the turntable is "r", "$V_0$" represents a moving speed (m/sec) of the conditioning head in the radial direction of the turntable at the start of the conditioning, "D" represents a size (m) of the conditioning head in the radial direction of the turntable, "Q" represents a distance (m) for which the conditioning head radially moves on the turntable when the turntable makes one rotation, and "n" represents a positive integer.

* * * * *